US009337829B2

(12) United States Patent
Nicollini et al.

(10) Patent No.: US 9,337,829 B2
(45) Date of Patent: May 10, 2016

(54) ELECTRONIC DEVICE WITH BODY-BIASING CIRCUIT FOR PORTABLE EQUIPMENT WITH USB CONNECTOR FOR HEADSET

(75) Inventors: Germano Nicollini, Piacenza (IT); Marco Zamprogno, Cesano Maderno (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 286 days.

(21) Appl. No.: 14/343,099

(22) PCT Filed: Sep. 5, 2012

(86) PCT No.: PCT/EP2012/067320
§ 371 (c)(1),
(2), (4) Date: Mar. 12, 2014

(87) PCT Pub. No.: WO2013/034595
PCT Pub. Date: Mar. 14, 2013

(65) Prior Publication Data
US 2014/0218096 A1    Aug. 7, 2014

Related U.S. Application Data

(60) Provisional application No. 61/549,456, filed on Oct. 20, 2011.

(30) Foreign Application Priority Data

Sep. 6, 2011    (EP) ..................................... 11180174

(51) Int. Cl.
*H03K 3/01*    (2006.01)
*H03K 17/687*    (2006.01)
*H03F 1/52*    (2006.01)
*H03F 3/185*    (2006.01)
*H03F 3/30*    (2006.01)

(52) U.S. Cl.
CPC .............. *H03K 17/6871* (2013.01); *H03F 1/52* (2013.01); *H03F 3/185* (2013.01); *H03F 3/301* (2013.01)

(58) Field of Classification Search
CPC ........................................................ H03K 3/01
See application file for complete search history.

(56) References Cited

U.S. PATENT DOCUMENTS

| | | | |
|---|---|---|---|
| 5,160,855 A | 11/1992 | Dobberpuhl | |
| 5,450,025 A | 9/1995 | Shay | |
| 6,043,681 A | 3/2000 | Lim | |
| 8,018,268 B1 * | 9/2011 | Williams | ........... H03K 17/0822 326/83 |
| 8,847,672 B2 * | 9/2014 | Prabhakar, III | ..... H01L 27/0629 327/434 |
| 2002/0021164 A1 | 2/2002 | Fugate et al. | |

FOREIGN PATENT DOCUMENTS

JP        2010171590 A      8/2010

* cited by examiner

*Primary Examiner* — Hai L Nguyen
(74) *Attorney, Agent, or Firm* — Coats & Bennett, PLLC

(57) ABSTRACT

An electronic USB or similar device 101 with a CMOS audio output stage 105 for driving, in a first mode, e.g., a headset via a port commonly used also in a second mode by a digital data transmission stage 103 for digital data and supply, the audio output stage P-channel transistor MP being switchably back-gate biased by a bias circuit 107 according to the operating mode to achieve high-voltage tolerance.

12 Claims, 3 Drawing Sheets

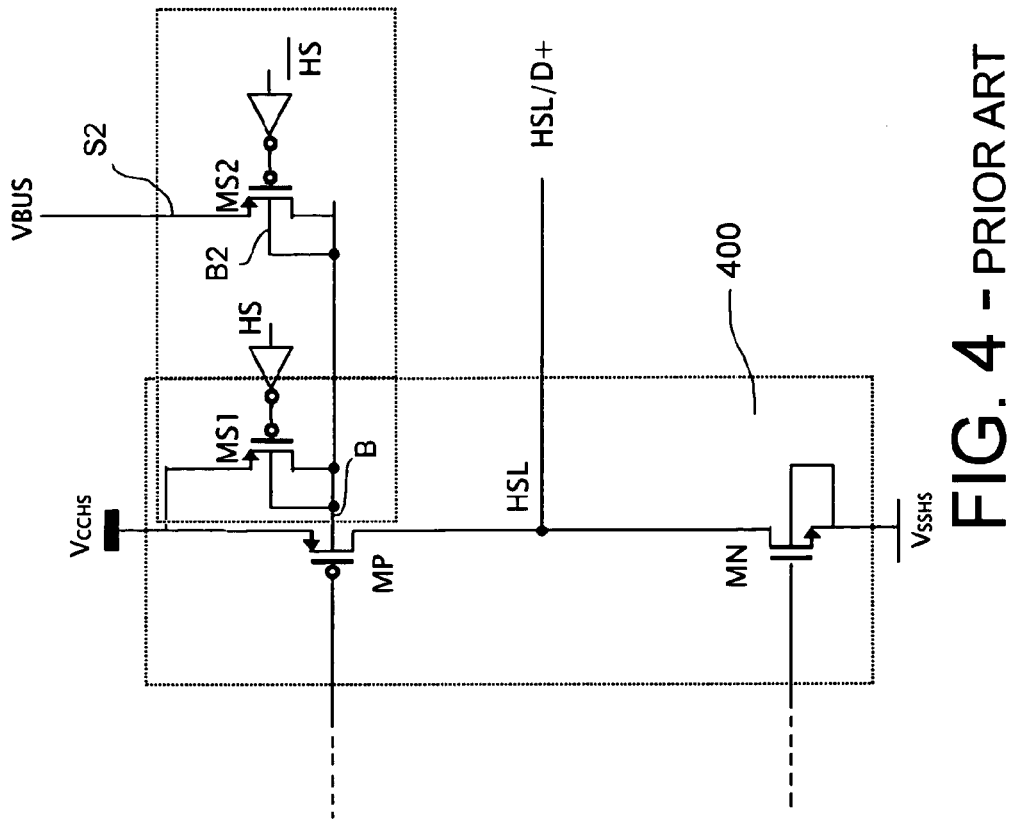
FIG. 4 – PRIOR ART
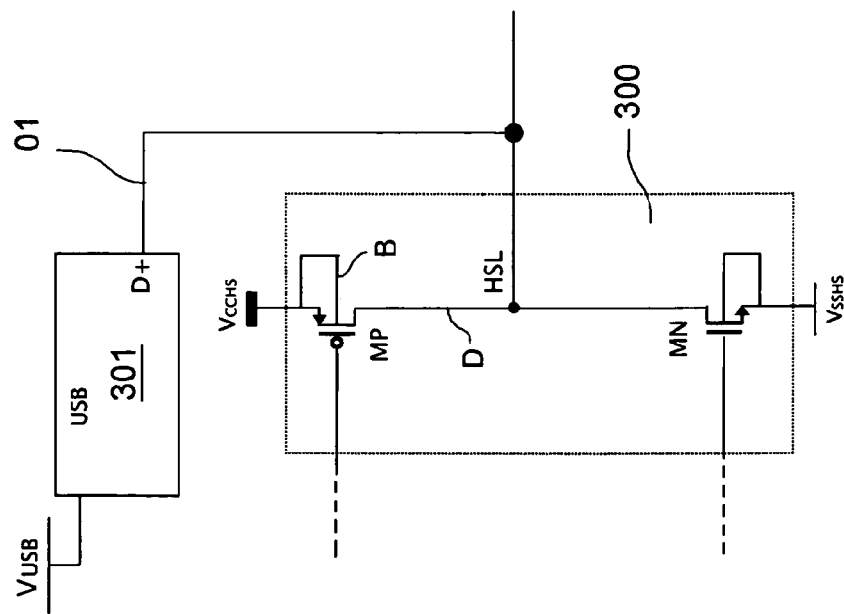
FIG. 3 – PRIOR ART

ELECTRONIC DEVICE WITH BODY-BIASING CIRCUIT FOR PORTABLE EQUIPMENT WITH USB CONNECTOR FOR HEADSET

TECHNICAL FIELD

The present invention relates to portable equipments with USB connector for headset and particularly to an electronic device with biasing circuit for portable equipment with USB connector for headset.

BACKGROUND ART

Recently, USB connector for headset has been requested in the new generation of portable equipments (e.g. mobile phones).

An USB connector is used both for USB digital data transfer and for USB headset audio listening. When the headset amplifier is selected for audio listening, the amplifier is powered ON, while the USB circuit is switched OFF with high impedance. The reverse happens when the USB circuit is selected for data transfer, i.e. the USB circuit is ON and headset amplifier is in power down with high output impedance.

Typically, a mobile phone with USB headset amplifiers comprises a USB charger arranged to supply a operative voltage VBUS of about 5V or 5.25V, a USB circuit and one or more headset amplifiers. The USB circuit is arranged to operate between a first reference voltage VUSB and a further referenced voltage GND. The USB circuit is provided with a first output terminal to provide a first digital data D1 and a second output terminal to provide a second digital data D2. Both the first D1 and second D2 digital data having a voltage value corresponding to the reference voltage VUSB (3V or 3.3V) or to the further reference voltage (0V). Moreover, according to USB requirements, the USB circuit has to withstand with a possible short-circuit between the high/low logical level of the transmitted digital data and the reference voltage VBUS provided by the USB charger without damaging. The headset amplifier positive supply voltage is usually from 1.5V to 2.1V, and the headset amplifier negative supply voltage is usually from -1.2V to -1.5V obtained with a negative charge pump circuit, as known by the man skilled in the art.

FIG. 3 shows the circuital implementation of an output stage 300 of a headset amplifier (not shown in the figure).

The output stage 300 comprises a PMOS transistor MP and NMOS transistor MN connected in series one another between the positive voltage supply of the amplifier VCCHS (e.g., 1.8V) and the negative voltage supply of the amplifier VSSHS (e.g. -1.4V).

The circuital implementation of FIG. 3 is used for the majority of headset amplifiers on the market, and anyway it is the only possible for the values of headset amplifier positive/ negative supply voltage less than few volts (as indicated above), as happens in modern technologies for mobile phones and particularly mobile phones with USB headset amplifier.

In USB mode (digital data transmission), the USB transceiver 301 is supplied by VUSB (typically, 3V or 3.3V) and the first digital signal D1 present on the output terminal O1 of the USB transceiver 301 has a voltage value equal to 3.3V and then is higher than the headset amplifier positive voltage supply VCCHS (1.8V), forwarding the junction diode between the drain terminal D and the body terminal B of the PMOS transistor MP. In addition, the USB transceiver 301 cannot source this current without degrading the data transmission speed, but also this huge current can also lead to reliability problems or to the breakdown of the junction of the PMOS transistor MP. The situation is even worsened considering that the output terminal O1 of the USB transceiver 301 can be accidentally short-circuited to the reference voltage VBUS (5.25V) of the USB charger, as already previously explained.

A first prior art solution is to connect the body terminal B of the PMOS transistor to the reference voltage VBUS of the USB charger, accepting a certain amount of body effect degradation on its threshold voltage. However, this first solution has several drawbacks: the PMOS transistor MP has already large dimensions for driving purpose, which would further increase just to compensate the body effect; the reference voltage VBUS is usually not present in headset audio listening mode; typically, the USB charger providing the reference voltage VBUS cannot be present in the same chip where USB transceiver and USB headset amplifier resides, thus VBUS signal is not accessible.

A second prior art solution, schematically illustrated in FIG. 4, is to connect the body terminal B of the PMOS transistor MP of the output stage 400 to the headset amplifier positive voltage supply VCCHS when the headset audio listening mode is selected (digital control signal HS=1), while switching it to the reference voltage VBUS of the USB charger when the USB data transmission mode is selected (digital control signal HS=0).

This second prior solution solves the first drawback related to body effect degradation. However, it requires that the reference voltage VBUS of the USB charger is powered down (pull-down) or in high-impedance when the USB audio listening mode is selected, otherwise the junction between the source terminal S2 and the body terminal B2 of the PMOS transistor MS2 is forward biased introducing unacceptable huge current consumption from the reference voltage VBUS to the positive voltage supply VCCHS and reliability problems. More important, this second prior art solution cannot be adopted when the VBUS is not accessible, i.e. the USB charger is not in the same chip of the USB circuit and the headset amplifier.

SUMMARY OF THE INVENTION

An object of the present invention is to provide an electronic device with biasing circuit for portable equipments with USB connector for headset which overcomes the drawbacks and limitations of the known prior art.

An electronic device according to the invention comprising: a digital data transmission stage having at least a first output terminal to provide a first digital signal having a voltage value corresponding to a first reference voltage or to a second reference voltage, the digital data transmission stage being arranged to operate when a function as a digital data transmission mode is selected; an audio signal amplification stage comprising at least a first amplifier having a first output stage comprising a PMOS transistor and a NMOS transistor connected in series one another between a third reference voltage and a fourth reference voltage, the audio signal amplification stage being arranged to operate when a function as an audio signal amplification mode is selected, said first output stage having a first output terminal connected to said at least first output terminal of the digital data transmission stage to provide an output signal, said output signal corresponding to said first digital signal when the function as a digital data transmission mode is selected or to an audio signal when the function as an audio signal amplification mode is selected; at least a first biasing circuit of the body terminal of the PMOS transistor of said first output stage. The at least a first biasing circuit according to the invention, when the function as a digital data transmission mode is selected, is arranged to supply to the body terminal of the PMOS transistor of the first output stage a biasing voltage corresponding to the highest between the voltage value of the output signal and the third reference voltage of the electronic device, the at least a first biasing circuit is further arranged, when the function as an audio signal amplification mode is selected, to supply to the body terminal of the PMOS transistor of the first output stage a biasing voltage corresponding to the third reference voltage of the electronic device.

A further embodiment of the invention is an electronic board comprising an electronic device according to the invention and an USB electrical charger.

A further embodiment of the invention is a portable equipment comprising an USB connector for headset and an electronic board.

BRIEF DESCRIPTION OF THE DRAWINGS

The characteristics and the advantages of the present electrical device with body-biasing circuit will be better understood from the following detailed description of one embodiment thereof, which is given by way of illustrative and non-limiting example with reference to the annexed drawings, in which:

FIG. 3 shows a circuit diagram of an USB circuit and an output stage of an headset amplifier of the prior art;

FIG. 4 shows a circuit diagram of an output stage of an headset amplifier having a PMOS transistor to be biased and a body-biasing circuit of the prior art.

DETAILED DESCRIPTION OF PREFERRED EMBODIMENTS

Circuit diagrams of a preferred embodiment of an electronic device with body-biasing circuit of the invention can be described with reference to FIGS. 1 and 2.

Figure 1:
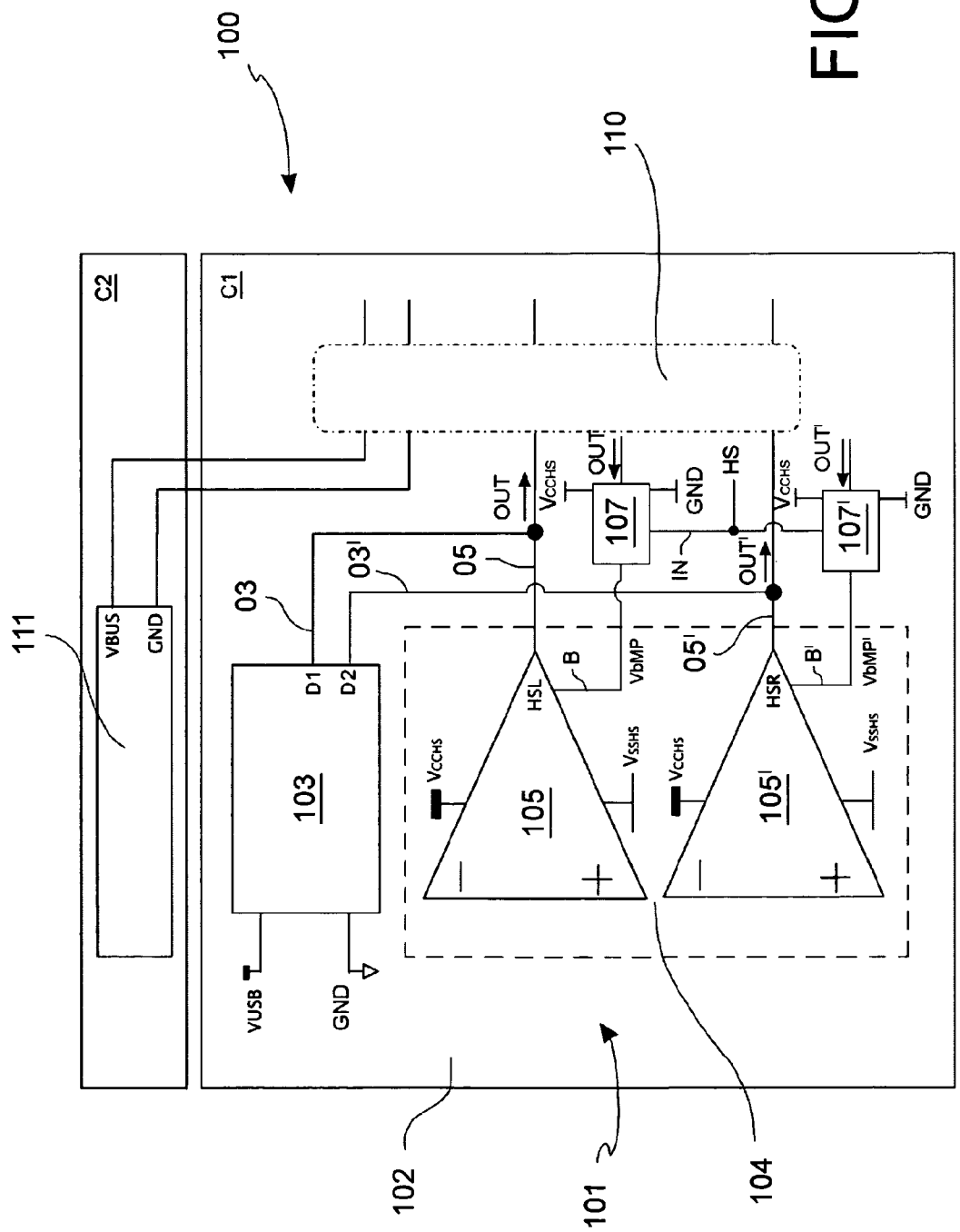
FIG. 1 shows a circuit diagram of a electronic board including the electronic device with high speed body-biasing circuit of the invention and an USB charger.

In particular, with reference to FIG. 1, a electronic board 100 comprises the electronic device 101 according to the invention and a USB charger 111. The USB charger is arranged to operate at a main operative voltage VBUS, for example a power supply, and a reference voltage GND, for example the ground. Examples of possible values for the power supply VBUS are 5V or 5.25V.

It should be noted that such an electronic device 101 can be integrated on a chip C1 of semiconductor material.

In a first embodiment of the electronic board 100 (not shown in the figures), also the USB charger 111 can be integrated on the same chip of the electrical device 101.

In a second embodiment of the electronic board 100 (illustrated in the FIG. 1), the USB charger 111 can be integrated on a further chip C2 of semiconductor material different from the chip C1.

The electronic board 100 can be used in any portable equipments having USB connector for headset, e.g. mobile or cellular phone, MP3 players, PDAs (Personal Digital Assistant), portable computers, tablets, and so on.

Figure 2:
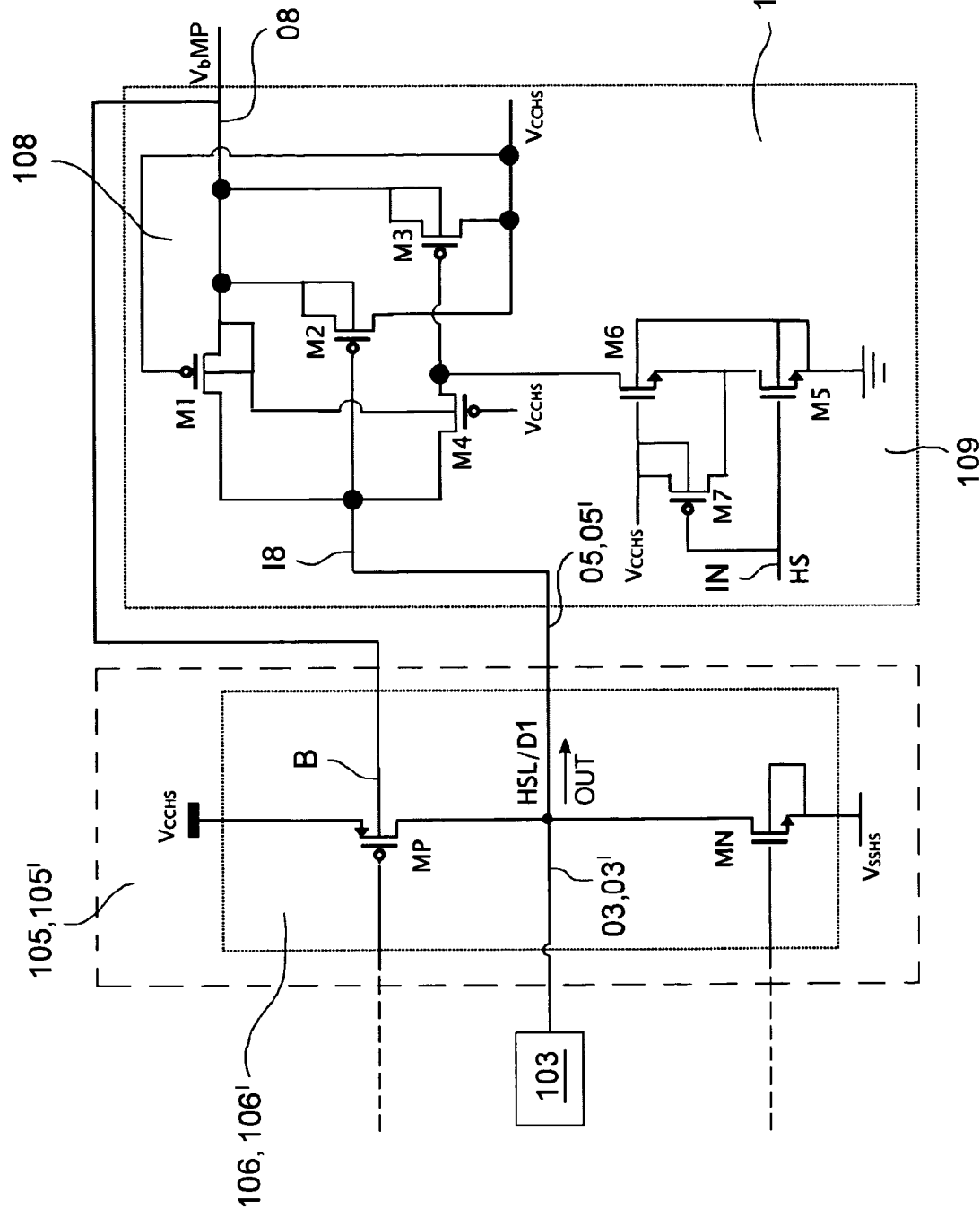
FIG. 2 shows a portion of the electronic boards of FIG. 1 representing from a circuital point of view a body-biasing circuit of the invention and an output stage of an headset amplifier having a PMOS transistor to be biased.

With reference to FIGS. 1 and 2, the electronic device 101 comprising a electrical portion 102 arranged to operate at a first reference voltage VUSB, for example a first power supply, and at a second reference voltage VCCHS, for example a second power supply. Examples of possible values of the first power supply VUSB are in the range 3.0 V-3.3 V. Examples of possible values of the second power supply VCCHS are in the range 1.5 V-2.1 V.

In particular, the electrical portion 102 comprising a digital data transmission stage 103 having at least a first output terminal O3 to provide a first digital signal D1 having a voltage value corresponding to the first reference voltage VUSB or to a further reference voltage GND, for example the ground.

In addition, the electrical portion 102 comprises a audio signal amplification stage 104 comprising at least an amplifier 105, e.g. an operational amplifier, having an output stage 106 comprising a PMOS transistor MP and a NMOS transistor MN connected in series one another between said second reference voltage VCCHS and a further reference voltage VSSHS, for example a further power supply. Example of possible values of such further power supply VSSHS are in the range −1.2V-1.5V.

The output stage 106 has a respective output terminal O5 connected to said at least first output terminal O3 of the digital data transmission stage 103 to provide an output signal OUT. Therefore, the output signal OUT corresponds to the first digital signal D1 in a digital data transmission mode of the electrical portion 102 or to an audio signal HSL in an audio amplification mode of the electrical portion 102.

In particular, the respective output terminal O5 of the output stage 106 corresponds to the drain terminal of the PMOS transistor MP connected to the drain terminal of the NMOS transistor MP. The PMOS transistor MP has the source terminal connected to the second reference voltage VCCHS and the drain terminal connected to the drain terminal of the NMOS transistor. The source terminal of the NMOS transistor MN is connected to the further reference voltage VSSHS. The gate terminal of both the PMOS transistor and the NMOS transistor are connected, respectively, to an amplification electrical circuit of the amplifier 105, not shown in the figures, which is arranged upstream the output stage 106.

With reference again to the electrical portion 102, it further comprises at least one biasing circuit 107 of the body terminal B of the PMOS transistor MP of said output stage 106.

The at least one biasing circuit 107 is advantageously arranged to supply to the body terminal B of the PMOS transistor MP of the output stage 106 a biasing voltage VbMP corresponding to the highest between the voltage value of the output signal OUT and the second reference voltage VCCHS of the electrical portion 102 of the electronic device 101.

Particularly, as it will be described in the following, in the digital data transmission mode of the electrical portion 102 of the electronic device 101, the at least one biasing circuit 107 is arranged to supply to the body terminal B of the PMOS transistor MP of the output stage 106 the biasing voltage VbMP corresponding to the highest between the voltage value of the first digital data D1 and the second reference voltage VCCHS.

Indeed, as it will be also described in detail in the following, in the audio signal amplification mode of the electrical portion 102 of the electronic device 101, the at least one biasing circuit 107 is arranged to supply to the body terminal B of the PMOS transistor MP of the output stage 106 the biasing voltage VbMP corresponding to the second reference voltage VCCHS.

In order to operate according to the operation mode of the electrical portion 102 of the electronic device 101, the at least one biasing circuit 107 preferably comprises an input terminal IN to receive a digital control signal HS representing the selected operation mode of the electrical portion 102 between the digital data transmission mode and the audio signal amplification mode.

With reference particularly to FIG. 2, the at least one biasing circuit 107 comprising a first circuital portion 108 having an input terminal I8 connected to the output terminal O5 of the output stage 106 and an output terminal O8 connected to the body terminal B of the PMOS transistor MP of the output stage 106.

In addition, the at least one biasing circuit 107 comprises a second circuital portion 109 having a input terminal corresponding to the input terminal IN of the at least one biasing circuit 107. Such second circuital portion 109 is connected between the second reference voltage VCCHS and the further reference voltage GND.

The first circuital portion 108 is connected to the further reference voltage GND via the second circuital portion 109.

From a circuital point of view, the first circuital portion 108 of the at least one biasing circuit 107 comprises a first PMOS transistor M1 having the respective gate terminal connected to the second reference voltage VCCHS, the respective drain terminal connected to the output terminal O5 of the output stage 106 and the respective source terminal and the respective body terminal connected to the body terminal B of the PMOS transistor MP of the output stage 106.

The first circuital portion 108 of the at least one biasing circuit 107 further comprises a second PMOS transistor M2 having the respective gate terminal connected to the output terminal O5 of the output stage 106, the respective drain terminal connected to the second reference voltage VCCHS, the respective source terminal and the respective body terminal connected to the body terminal B of the PMOS transistor MP of the output stage 106.

In addition, the first circuital portion 108 of the at least one biasing circuit 107 further comprises a third PMOS transistor M3 having the respective drain terminal connected to the second reference voltage VCCHS, the respective source terminal and the respective body terminal connected to the body terminal B of the PMOS transistor MP of the output stage 106.

Lastly, the first circuital portion 108 of the at least one biasing circuit 107 further comprises a fourth PMOS transistor M4 having the respective gate terminal connected to the second reference voltage VCCHS, the respective drain terminal connected to the output terminal O5 of the output stage 106, the respective body terminal connected to the body terminal B of the PMOS transistor MP of the output stage 106, the respective source terminal connected to the gate terminal of the third PMOS transistor M3.

With reference to the second circuital portion 109 of the biasing circuit 107 of FIG. 2, it comprises a first NMOS transistor M5 having the respective gate terminal corresponding to the input terminal IN of the at least one biasing circuit 107, the respective source terminal and the respective body terminal connected to the further reference voltage GND.

Furthermore, the second electrical circuit 109 further comprises a second NMOS transistor M6 having the respective gate terminal connected to the second reference voltage VCCHS, the drain terminal connected to the source terminal of the fourth PMOS transistor M4 of the first circuital portion 108, the respective source terminal connected to the drain terminal of the first NMOS transistor M5, the respective body terminal connected to the further reference voltage GND.

In addition, the second electrical portion 109 comprises a fifth PMOS transistor M7 having the respective gate terminal connected to the gate terminal of the first NMOS transistor M5, the respective drain terminal connected to the drain terminal of the first NMOS transistor M5, the respective source and the respective body terminal connected to the second reference voltage VCCHS.

Turning back to FIG. 1, the electrical portion 102 further comprises an USB connector 110.

In addition, from a circuital point of view, the output terminal O5 of the at least an amplifier 105 connected to the at least a first output terminal O3 of the digital data transmission stage 103 is connected to the USB connector 110.

Furthermore, also the USB charger 111 is connected to the USB connector 110 via two terminals corresponding to the main operative voltage VBUS and the reference voltage GND, respectively.

With reference to the embodiment illustrated in FIG. 1, the digital data transmission stage 103 of the electronic device 101 has two output terminals O3 and O3' to provide a two digital signal D1 and D2 having a voltage value corresponding to the first reference voltage VUSB or to the further reference voltage GND.

In addition, the audio signal amplification stage 104 of the electronic device 101 comprises two amplifiers 105 and 105' analogous to said at least an amplifier 105, previously described.

Particularly, the output stages 106 and 106' of said two amplifiers 105 and 105' have a respective output terminal O5 and O5' connected to the output terminals O3 and O3' of the digital data transmission stage 103, respectively.

Particularly, the electrical portion 102 of the electronic device 101 of FIG. 1 comprises two biasing circuits 107 and 107' of the body terminal of the PMOS transistor of the output stages 106 and 106' of said two amplifiers 105 and 105', respectively.

The two biasing circuits 107 and 107' have the same input terminal IN to receive the digital control signal HS.

Furthermore, the two biasing circuits 107 and 107' are analogous to the at least one biasing circuit 107, previously describe in detail.

Furthermore, the two output terminals O5 and O5' of the two amplifiers 105 and 105' connected to the two output terminal O3 and O3', respectively, of the digital data transmission stage 103 are connected to the USB connector 110 of the electronic device 101.

In more detail, one (105) of the two amplifiers is arranged to amplify the audio signal of the left side of a headset (not shown in the figure) and the other (105') of the two amplifiers is arranged to amplify the audio signal of the right side of the headset.

The headset is arranged to be connected to the electronic device 101 (and therefore to the electronic board 100) via the USB connector 110.

An example of a portable equipment employing the electronic device 101 according to the invention comprises an USB connector for headset and the electronic board 100, previously described.

Taking the above considerations into account, the behavior of the electronic device 101 of the present invention is described below, with particular reference to the circuit diagram of FIG. 2, i.e. the portion of the audio amplification stage 104 arranged to amplify the audio signal for one side of the headset, e.g. the left side.

In the data transmission mode of the electrical portion 102, the digital control signal HS provided to the input terminal IN of the second circuital portion 109 of the at least one biasing circuit 107 is equal for example to 0. Furthermore, the output signal OUT present of the input terminal I8 of the first electrical portion 108 of the at least one biasing circuit 108 correspond to the digital data D1 only (no audio signal HSL is present).

Thus, the first NMOS transistor M5 of the second electrical portion 109 of the at least one biasing circuit 107 is OFF.

With reference to the behavior of the first electrical portion 108 of the at least one biasing circuit 107, in the case the voltage value of the first digital data D1 is at a low level (corresponding to the further reference voltage GND, e.g. 0V), the second PMOS transistor M2 is ON, the first PMOS transistor M1 and the fourth PMOS transistor M4 are OFF while the condition (ON or OFF) of the third PMOS transistor M3 is not important because it is in parallel to the second PMOS transistor M2 (ON).

In view of the above, the bias voltage VbMP supplied by the at least one biasing circuit 107 to the body terminal B of the PMOS transistor MP of the output stage 106 is equal to the second reference voltage VCCHS.

In the case the voltage value of the first digital data D1 is at a high level (corresponding to the first reference voltage VUSB, e.g. 3V or 3.3V), the first PMOS transistor M1 and the fourth PMOS transistor M4 are ON while the second PMOS transistor M2 and the third PMOS transistor M3 are OFF.

In view of this, the bias voltage VbMP supplied by the at least one biasing circuit 107 to the body terminal B of the PMOS transistor MP of the output stage 106 is equal to the first digital data D1 (output signal OUT).

Therefore, it is confirmed that in the data transmission mode of the electrical portion 102, the bias voltage VbMP supplied to the body terminal B of the PMOS transistor MP of the output stage 106 correspond to the highest between the voltage value of the first digital data D1 and the second reference voltage VCCHS.

In the audio transmission mode of the electrical portion 102, the digital control signal HS provided to the input terminal IN of the second circuital portion 109 of the at least one biasing circuit 107 is equal for example to 1. Furthermore, the output signal OUT present at the input terminal I8 of the first electrical portion 108 of the at least one biasing circuit 107 correspond to the audio signal HSL only. The audio signal HSL (and also the audio signal HSR) is preferably of the analog type. Examples of voltage value of the audio signal HSL (and HSR) are in the range −1V-+1V.

In the audio transmission mode, the first PMOS transistor M1 of the first electrical portion 108 is OFF.

The second PMOS transistor M2 can be ON or OFF depending on the voltage value of the audio signal HSL.

Notwithstanding, the fourth PMOS transistor M4 is OFF to advantageously isolate the gate terminal of the third PMOS transistor M3 from the audio signal HSL.

In addition, the first NMOS transistor M5 of the second electrical portion 109 is ON. In view of this and considering that the second NMOS transistor M6 is always ON, a current flows into the second electrical portion 109 forcing the gate terminal of the third PMOS transistor M3 to the further reference voltage GND (0V). Thus, the third PMOS transistor M3 is always ON and therefore the bias voltage VbMP supplied to the body terminal B of the PMOS transistor MP of the output stage 106 is equal to the second reference voltage VCCHS.

Therefore, it is confirmed that in the audio signal amplification mode of the electrical portion 102, the at least one biasing circuit 107 is arranged to supply to the body terminal B of the PMOS transistor MP of the output stage 106 a biasing voltage VbMP corresponding to the second reference voltage VCCHS.

With reference again to the behavior of the at least one biasing circuit 107, it should be noted that the second NMOS transistor M6 and the fifth PMOS transistor M7 of the second circuital portion 109 have been introduced in order to improve the reliability of the biasing circuit in the case the electrical portion 102 operates in the data transmission mode.

In fact, as previously indicated, in the case of data transmission mode of the electrical portion 102 with the first digital data D1 at high level, the fourth PMOS transistor M4 is ON and the gate terminal of the third PMOS transistor M3 can be at a voltage value corresponding to the first digital data D1.

In the case of short circuit to the main operative voltage VBUS of the USB charger 111, the first digital data D1 can be equal to VBUS (e.g. 5.25V). Therefore, without the second NMOS transistor M6 and the fifth PMOS transistor M7, the first NMOS transistor M5 would have both the gate-source voltage and the drain-source voltage equal to VBUS=5.25V which are higher than the maximum values of about 3.6V imposed by process reliability, in the case of the examples of voltage values previously indicated.

Introducing the second NMOS transistor M6 only having the respective gate terminal connected to the second reference voltage VCCHS, the above illustrated problem is not solved because the drain-source voltage of the second NMOS transistor M6 would be VBUS−(VCCHS−VT)=5.25V−(1.8V−0.6V)=4.1V which is higher again than 3.6V.

On the other hand, by introducing also the fifth PMOS transistor M7 is possible to force the source terminal of the second NMOS transistor M6 of the second electrical portion 109 to the second reference voltage VCCHS so that the drain-source voltage of the second NMOS transistor M6 is advantageously equal to VBUS−VCCHS=5.25−1.8=3.45V which is lower than 3.6V, in the case of the examples of voltage values previously indicated, solving the reliability problem above indicated.

The electronic device of the invention allows supplying the body terminal of a PMOS transistor of the output stage with a bias voltage corresponding to the highest between the voltage value of the output signal OUT and the second reference voltage VCCHS, both present in the electrical portion 102 of the electronic device.

In other words, the electronic device of the invention allows the perform the biasing of a body terminal in a portable equipment with USB connector for headset without using the main operative voltage VBUS and therefore overcoming the drawbacks above mentioned with reference to the cited prior art.

In addition, the biasing circuit of the electronic device is of a high-speed type because the circuit is made by only switches (PMOS and NMOS transistors) and no active circuits or feedbacks are needed.

A body-biasing circuit having high speed performance can be advantageously used in portable equipment with USB connector for headset in which the USB transmission speed can reach several hundred of MHz.

Lastly, the arrangement of the biasing circuit of the invention (transistors M6 and M7) allows obtaining high speed biasing performance taking care the reliability of the biasing circuit. In fact, modern CMOS processes impose voltage limitations of about 3.6V on the maximum value of both the gate-source voltage and the drain-source voltage to avoid degradation of the MOS transistor characteristics or breakdown.

The invention claimed is:

1. An electronic device comprising:
a digital data transmission stage having at least a first output terminal operative to provide a first digital signal having a voltage value corresponding to one of a first reference voltage or a second reference voltage, the digital data transmission stage being arranged to operate when a function as a digital data transmission mode is selected;
an audio signal amplification stage comprising at least a first amplifier having a first output stage comprising a PMOS transistor and an NMOS transistor connected in series with one another between a third reference voltage and a fourth reference voltage, the audio signal amplification stage being arranged to operate when a function as an audio signal amplification mode is selected,
said first output stage having a first output terminal connected to said at least first output terminal of the digital data transmission stage and operative to provide an output signal, said output signal corresponding to said first digital signal when the function as a digital data transmission mode is selected and corresponding to an audio signal when the function as an audio signal amplification mode is selected; and
at least a first biasing circuit of the body terminal of the PMOS transistor of said first output stage;
wherein the first biasing circuit, when the function as a digital data transmission mode is selected, is arranged to supply to the body terminal of the PMOS transistor of the first output stage a biasing voltage corresponding to the highest between the voltage value of the output signal and the third reference voltage of the electronic device; and
wherein the first biasing circuit is further arranged, when the function as an audio signal amplification mode is selected, to supply to the body terminal of the PMOS transistor of the first output stage a biasing voltage corresponding to the third reference voltage of the electronic device.

2. The electronic device of claim 1, wherein the first biasing circuit comprises a first input terminal operative to receive a digital control signal representing the selected function between the function as a digital data transmission mode and the function as an audio signal amplification mode.

3. The electronic device of claim 1, wherein the first biasing circuit further comprises a second input terminal connected to the first output terminal of the first output stage and a second output terminal connected to the body terminal of the PMOS transistor of the first output stage.

4. The electronic device of claim 3, wherein the first biasing circuit comprises:
a first PMOS transistor having a gate terminal connected to the third reference voltage, a drain terminal connected to the first output terminal of the first output stage, and a source terminal and a body terminal connected to the body terminal of the PMOS transistor of the first output stage;
a second PMOS transistor having a gate terminal connected to the first output terminal of the first output stage, a drain terminal connected to the third reference voltage, and a source terminal and a body terminal connected to the body terminal of the PMOS transistor of the first output stage;
a third PMOS transistor having a drain terminal connected to the third reference voltage, and a source terminal and a body terminal connected to the body terminal of the PMOS transistor of the first output stage; and
a fourth PMOS transistor having a gate terminal connected to the third reference voltage, a drain terminal connected to the first output terminal of the first output stage, a body terminal connected to the body terminal of the PMOS transistor of the first output stage, and a source terminal connected to the gate terminal of the third PMOS transistor.

5. The electronic device of claim 4, wherein the first biasing circuit further comprises:
a first NMOS transistor having a gate terminal corresponding to the input terminal of the first biasing circuit, and a source terminal and a body terminal connected to the second reference voltage;
a second NMOS transistor having a gate terminal connected to the third reference voltage, a terminal connected to the source terminal of the fourth PMOS transistor, a source terminal connected to the drain terminal of the first NMOS transistor, and a body terminal connected to the second reference voltage; and
a fifth PMOS transistor having a gate terminal connected to the gate terminal of the first NMOS transistor, a drain terminal connected to the drain terminal of the first NMOS transistor, and a source and a body terminal connected to the third reference voltage.

6. The electronic device of claim 5, further comprising an USB connector, wherein the first output terminal of the first output stage is connected to the first output terminal of the digital data transmission stage being connected to the USB connector.

7. The electronic device of claim 1, wherein the digital data transmission stage comprises a second output terminal operative to provide a second digital signal having a voltage value corresponding to one of the first reference voltage and the second reference voltage, wherein the audio signal amplification stage further comprises a second amplifier comprising a second output stage, the second amplifier being analogous to said first amplifier, and wherein the second output stage of the second amplifier comprises a first output terminal connected to the second output terminal of the digital data transmission stage.

8. The electronic device of claim 7, further comprising a second biasing circuit of the body terminal of the PMOS transistor of the second output stage of said second amplifier, said second biasing circuit having the same input terminal to receive the digital control signal, said second biasing circuit being analogous to the first biasing circuit.

9. The electronic device of claim 8, wherein the first output terminal of the second amplifier is connected to the second output terminal of the digital data transmission stage and is connected to the USB connector.

10. The electronic device of claim 8, wherein the first amplifier is arranged to amplify an audio signal of a left side of a headset and the second amplifier is arranged to amplify an audio signal of a right side of the headset, said headset being arranged to be connected to the electronic device via the USB connector.

11. The electronic device of claim 1, further comprising a USB electrical charger.

12. Portable electronic equipment comprising:
an USB connector for a headset;
a digital data transmission stage having at least a first output terminal operative to provide a first digital signal having a voltage value corresponding to one of a first reference voltage or a second reference voltage, the digital data transmission stage being arranged to operate when a function as a digital data transmission mode is selected;

an audio signal amplification stage comprising at least a first amplifier having a first output stage comprising a PMOS transistor and an NMOS transistor connected in series with one another between a third reference voltage and a fourth reference voltage, the audio signal amplification stage being arranged to operate when a function as an audio signal amplification mode is selected, said first output stage having a first output terminal connected to said at least first output terminal of the digital data transmission stage and operative to provide an output signal, said output signal corresponding to said first digital signal when the function as a digital data transmission mode is selected and corresponding to an audio signal when the function as an audio signal amplification mode is selected; and at least a first biasing circuit of the body terminal of the PMOS transistor of said first output stage;

wherein the first biasing circuit, when the function as a digital data transmission mode is selected, is arranged to supply to the body terminal of the PMOS transistor of the first output stage a biasing voltage corresponding to the highest between the voltage value of the output signal and the third reference voltage of the electronic device; and wherein the first biasing circuit is further arranged, when the function as an audio signal amplification mode is selected, to supply to the body terminal of the PMOS transistor of the first output stage a biasing voltage corresponding to the third reference voltage of the electronic device.

\* \* \* \* \*